United States Patent [19]
Lichtblau

[11] 3,913,219
[45] Oct. 21, 1975

[54] PLANAR CIRCUIT FABRICATION PROCESS

[76] Inventor: George Jay Lichtblau, 425 E. 63rd St., New York, N.Y. 10021

[22] Filed: May 24, 1974

[21] Appl. No.: 473,187

[52] U.S. Cl. .................... 29/592; 29/25.42; 29/625; 174/68.5; 317/101 F; 317/256

[51] Int. Cl.[2] ........................ H05K 3/06; H01G 7/00

[58] Field of Search .......... 29/625, 25.42, 592, 602; 174/68.5; 204/15, 23, 32 R, 129.6, 129.6 S; 156/3, 6, 8, 13; 317/101 B, 101 F, 101 A, 242, 256; 117/93.1 R, 93.1 CD

[56] References Cited

UNITED STATES PATENTS

| | | | |
|---|---|---|---|
| 2,849,298 | 8/1958 | Werberig | 156/3 |
| 2,974,284 | 3/1961 | Parker | 156/8 X |
| 3,240,647 | 3/1966 | Morgan | 29/625 UX |
| 3,340,606 | 9/1967 | Anderson et al. | 29/625 |
| 3,448,516 | 6/1969 | Buck | 29/625 |
| 3,484,731 | 12/1969 | Rich | 29/625 X |
| 3,485,688 | 12/1969 | Irvine | 174/68.5 X |
| 3,655,496 | 4/1972 | Ettre | 174/68.5 UX |
| 3,678,437 | 7/1972 | Vaden | 174/68.5 X |
| 3,678,577 | 7/1972 | Weglin et al. | 174/68.5 X |
| 3,808,680 | 5/1974 | Lafrate et al. | 29/625 |

*Primary Examiner*—C. W. Lanham
*Assistant Examiner*—Joseph A. Walkowski
*Attorney, Agent, or Firm*—Weingarten, Maxham & Schurgin

[57] ABSTRACT

A process for the high volume fabrication of planar electrical circuits having precision electrical characteristics and especially adapted for use in electronic security systems employing resonant circuits. A multiplicity of circuits are formed by high speed printing techniques on opposite surfaces of an insulative web and the individual circuits separated for use.

30 Claims, 12 Drawing Figures

7

PLANAR CIRCUIT FABRICATION PROCESS

FIELD OF THE INVENTION

This invention relates to the fabrication of flexible planar printed circuits and more particularly to the fabrication of planar resonant circuits having precision electrical characteristics.

BACKGROUND OF THE INVENTION

Techniques are known for fabricating printed circuits and flexible printed circuits but such techniques have not been wholly satisfactory for the volume production of low cost circuits required for many purposes. For example, in electronic security systems such as shown in copending applications Ser. Nos. 214,361 and 262,465 of the same inventor as herein, a resonant circuit affixed as a tag to an item being protected is electronically interrogated at a controlled area to determine tag presence and upon such detection is electronically altered to destroy the resonant properties of the tag circuit at its detection frequency. The tag circuits are often expendable and are only used once, such as on items sold in retail store, and are useable in great quantities. Thus, the unit cost should be extremely low to not markedly affect the economies of maintaining an electronic security system. With conventional printed circuit techniques, the circuit pattern is applied to a substrate by silk screening or by photoprocessing techniques. The silk screening technique is slow and often requires considerable skilled labor especially in producing high accuracy circuits. Photoprocessing techniques are complex and require the use of expensive chemicals. In both techniques special surface treatment of the substrate and deposited conductive layers must often be employed, thereby increasing the overall complexity of the fabrication process. In most conventional printed circuit processes, cleaning and washing steps are employed after each stage of the process, which adds to overall cost and complexity.

SUMMARY OF THE INVENTION

According to the invention, a circuit fabrication process is provided for the high volume production of resonant tag and other high accuracy circuits at extremely low cost and in a highly automated manner. The invention makes use of high speed printing techniques utilized in a unique processing sequence which does not require special surface treatments during the process. At an initial stage of the novel process, an electrically insulative substrate is provided having directly bonded on each opposite surface thereof a conductive foil. The thickness of the insulative substrate is maintained to an accurate tolerance commensurate with the intended resonant properties of a completed tag circuit, which is formed by planar patterns on both conductive surfaces. The dielectric properties of the substrate are also selected to yield intended electrical properties in a completed circuit.

DESCRIPTION OF THE DRAWINGS

The invention will be more fully understood from the following detailed description taken in conjunction with the accompanying drawings, in which.

DETAILED DESCRIPTION OF THE INVENTION

Figure 1:
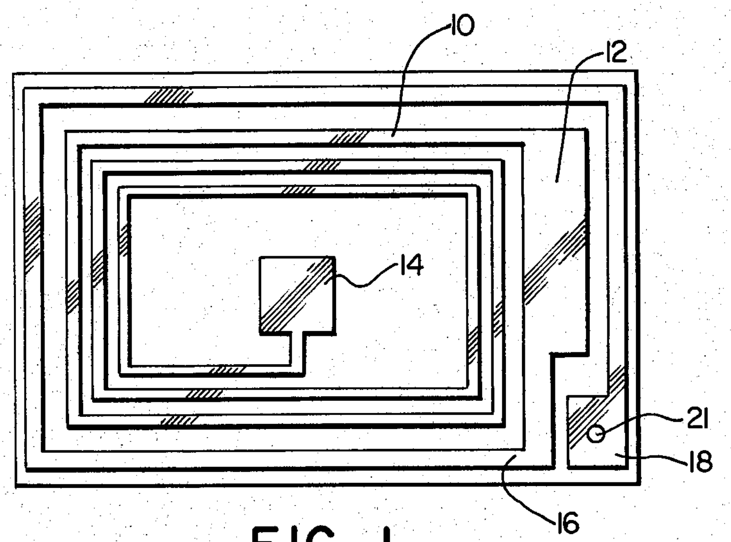
FIG. 1 is a pictorial view of one side of a resonant tag circuit fabricated according to the invention.
Figure 2:
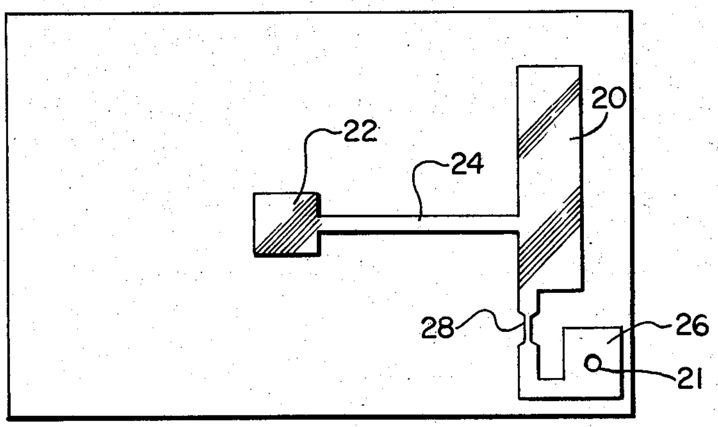
FIG. 2 is a pictorial view of the opposite side of the resonant tag circuit of FIG. 1.

The novel process is especially useful in providing resonant tag circuits such as described in the aforesaid copending applications relating to electronic security systems for preventing the unauthorized removal of items from a controlled area. The resonant tag circuit itself is shown in FIGS. 1 and 2, which respectively depict the opposite planar surfaces of the tag. Referring to FIG. 1, there is shown a rectangular spiral conductive path 10 extending between an outer conductive area 12 and an inner conductive area 14. A conductive path 16 also extends from conductive area 12 around the periphery of path 10 to a conductive area 18.

On the opposite surface of the tag, shown in FIG. 2, conductive areas 20 and 22 are provided in registration with respective conductive areas 12 and 14 and are interconnected by a conductive path 24. A conductive area 26 is provided in registration with conductive area 18 and is coupled to area 20 by a relatively narrow conductive path 28. The conductive areas 12 and 14 are cooperative with corresponding conductive areas 20 and 22 to provide first and second capacitors for the tag circuit. First and second inductors are provided by conductive paths 10 and 16, respectively. The conductive path 28 serves as a fusible link which during operation of the electronic security system can be electrically destroyed to alter the resonant properties of the tag circuit, as described in the aforesaid copending application. A conductive interconnection 21 couples areas 18 and 26 to complete the circuit.

Figure 3:
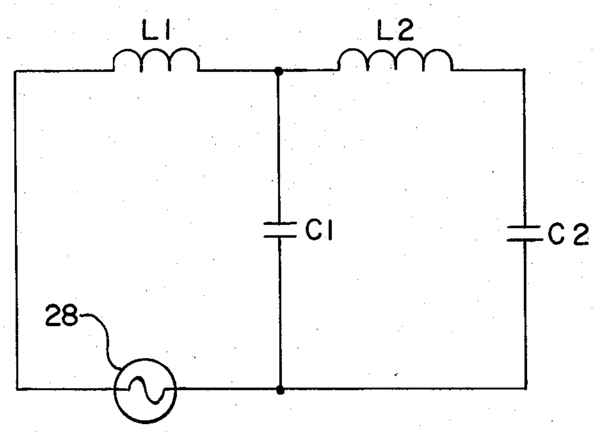
FIG. 3 is a schematic diagram of the equivalent electrical circuit of the resonant tag circuit of FIGS. 1 and 2.

The resonant circuit provided by the tag of FIGS. 1 and 2 is shown in electrical schematic form in FIG. 3, and it will be appreciated that this circuit configuration provides two resonant frequencies. The conductive paths 10 and 16 serve as respective inductors L2 and L1 of the resonant circuit. The conductive areas 12 and 20 separated by the interposed substrate serve as capacitor C1, while capacitor C2 is formed by the conductive areas 14 and 22. The series combination composed of inductors L1, L2 and capacitor C2 are tuned to a detection frequency. The loop composed of inductor L1 and capacitor C1 is tuned to a destruction frequency. Destruction of the resonant properties of the tag at the detection frequency is accomplished by application of energy at the destruction frequency to cause fusing of link 28.

In the electronic security system of the copending applications, a first resonant frequency is provided for detection of tag presence at a controlled zone, while a second resonant frequency is provided for destruction of the fusible link of the tag to thus destroy tag resonance at the first or detection frequency. As a result, the presence of a tag at a controlled zone having a detectable first resonant frequency is indicative of the unauthorized removal of an item bearing the tag. When an item bearing a tag is to be properly removed from the controlled area, the fusible link is first destroyed by application of energy at the second resonant frequency to destroy the resonant properties of the tag at the detection frequency, such that the tag can be removed from the controlled area without causing an alarm.

Resonant circuits of the type described above require very accurate dimensions and tolerances to achieve requisite resonant properties. The substrate material thickness must be within relatively close tolerances, as should the thickness of the conductive films provided on the substrate surfaces and the dimensions of the conductive patterns thereon. Moreover, the relatively close tolerances must be achievable on a high volume production basis at relatively low cost to be economically realistic for commercial use, especially where a tag circuit is to be expendable such as after a single use.

As an initial step of the novel process for fabricating a resonant tag circuit such as that shown above, both sides of a web of insulative material which forms the substrate of the tag circuit are coated or laminated with a conductive material to serve as the conductive surfaces from which circuit patterns are formed. The substrate is an electrically insulative material having a low dissipation factor at a frequency of interest and a stable dielectric constant; typically, plastic materials such as polyethylene, polypropylene, Teflon and polyisobutylene are suitable for the purpose. Polyethylene is especially preferred by reason of its low cost and its easy bondability to aluminum foil which is preferably employed for the conductive surfaces by reason of its relatively low cost. The conductive surfaces can also be of other materials providing the intended electrical conductivity such as silver or copper. The polyethylene film has a typical thickness of 0.001 inches with a thickness tolerance of ±5%. The film is treated by corona discharge by passing the film between two charged plates providing an ionizing atmosphere therebetween, such that there is a constant static discharge between the plates and through the film. This treatment is similar to that employed for providing a printable surface on plastic material, and conditions the surface of the plastic so that it can be more easily bonded to the aluminum foil.

Figure 4:
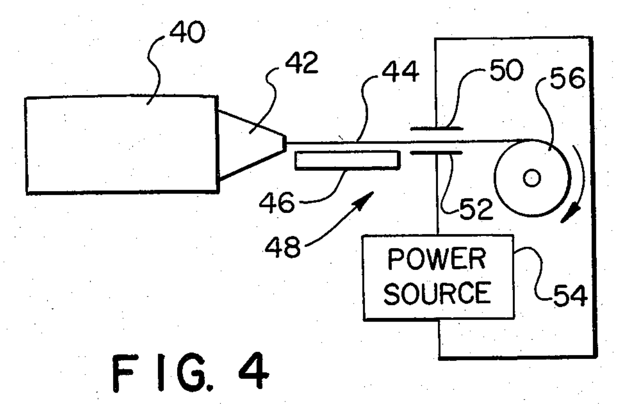
FIG. 4 is a diagrammatic representation showing the fabrication of the circuit substrate web.

Fabrication of the substrate is illustrated diagrammatically in FIG. 4, wherein an extruder 40 having an extrusion die 42 produces a continuous web 44 of high density polyethylene or other suitable material onto a cooled metal plate 46. The film is then passed through corona discharge treating apparatus 48 such as charged plates 50 and 52 energized by source 54, after which the web is wound on a storage reel 56 or directed to the next processing station.

Figure 5:
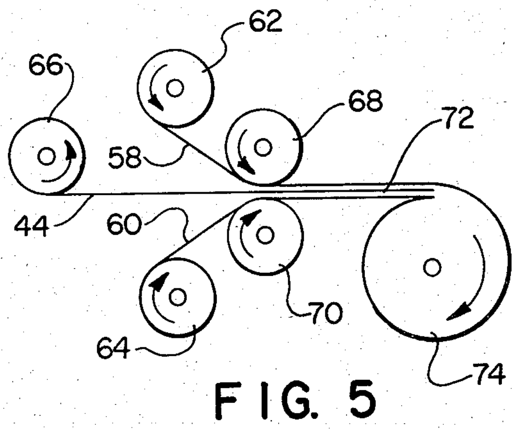
FIG. 5 is a diagrammatic representation showing the provision of a conductive surface on both sides of the substrate.

The layers of conductive material provided on both surfaces of the substrate web are preferably aluminum by reason of its good conductivity and relatively low cost. As shown in FIG. 5, aluminum foil layer 58 and 60 supplied from respective reels 62 and 64 are laminated to respective sides of the polyethylene web 44 provided from reel 66, with the dull side of the foil in contact with the substrate web, by means of heated pressure rollers 68 and 70, the laminated web 72 then being wound on a storage reel 74. The dull side of the aluminum foil is in contact with the substrate web to provide better bondability to the substrate than the opposite shiny aluminum surface. The dull side of the foil has a greater surface roughness then the shiny surface and, therefore, provides greater surface area for bonding to the substrate. Moreover, the shiny surface, being of finer surface texture than the dull surface, contains less residual oil from the foil rolling process and thus ink adheres more readily to the shiny surface. Printing can be accomplished on the dull foil surface so long as the surface is sufficiently free of residual oil to permit adherence of ink. In the preferred implementation of the invention, no chemical cleaning of the conductive foil is required. Printing on the dull surface would usually require chemical or similar cleaning treatment prior to application of ink.

One aluminum foil is thicker than the other to provide lower electrical resistance for the inductive coils to be formed as part of the resonant tag circuit. The thinner aluminum foil provides the material for the fusible link and also minimizes the amount of aluminum needed to fabricate the circuit to thus conserve cost. Typically, the thicker foil is 0.002 inch thick while the thinner foil is 0.00035 inch thick, with the aluminum being of type 1145 dead soft. The laminated web is trimmed to a suitable width for subsequent processing, a usual width of two feet being employed, the web being of any convenient length for reeled storage.

The laminated web is next printed on both surfaces of the aluminum foil with the particular patterns required for the resonant tags being produced. A plurality of repetitive patterns is printed across the width of the laminated web to provide a plurality of resonant tags which are subsequently separated for individual use. Printing is preferably accomplished in a web fed rotogravure press having accurate control of front to back registration. The ink is of a type providing good coverage with substantially no pin holes or other breaks which would affect circuit formation. The print rollers of the press are configured to promote maximum ink coverage and the ink is preferably a black carbon filled nitrocellulose based lacquer or a vinyl based ink. As an example, black nitrocellulose ink, Sun Chemical Co. No. 73793 has been employed, the ink being diluted in a solvent containing in approximate proportions one third toluol, one third ethyl acetate and one third ethyl alcohol. The ink is diluted until a viscosity is achieved for intended ink coverage, and printing of the circuit patterns on the aluminum surfaces is accomplished by a rotogravure press operating with a web speed of 200 feet per minute.

Figure 6:
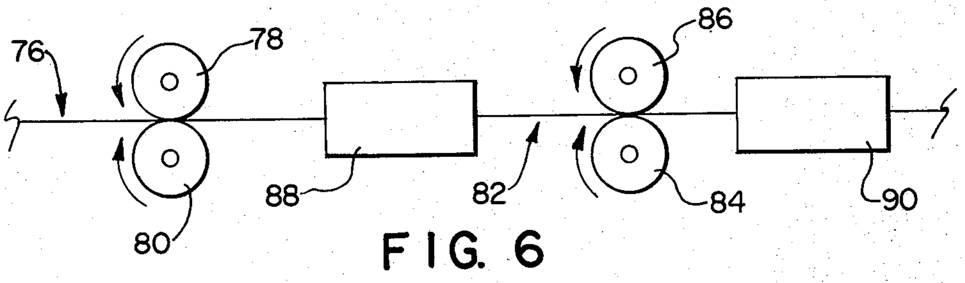
FIG. 6 is a diagrammatic representation of a printing station at which the circuit patterns are provided on the conductive surfaces.

Referring to FIG. 6, the circuit pattern is printed on aluminum surface 76 by print roller 78 working in cooperation with backing roller 80, while printing of the circuit pattern on the opposite surface 82 is accomplished by print roller 84 and cooperative backing roller 86. Drying apparatus 88 and 90 can be provided for drying the ink at each application station. Such apparatus can include heaters for heating the ink to cause greater fusion to the aluminum surface as is desirable for certain types of ink such as a vinyl based ink. The heat is sufficient to melt the vinyl which is in suspension in the ink composition to cause fusion of the vinyl particles to each other and to the aluminum to thereby more efficiently bond the ink to the aluminum surface.

Figure 7:
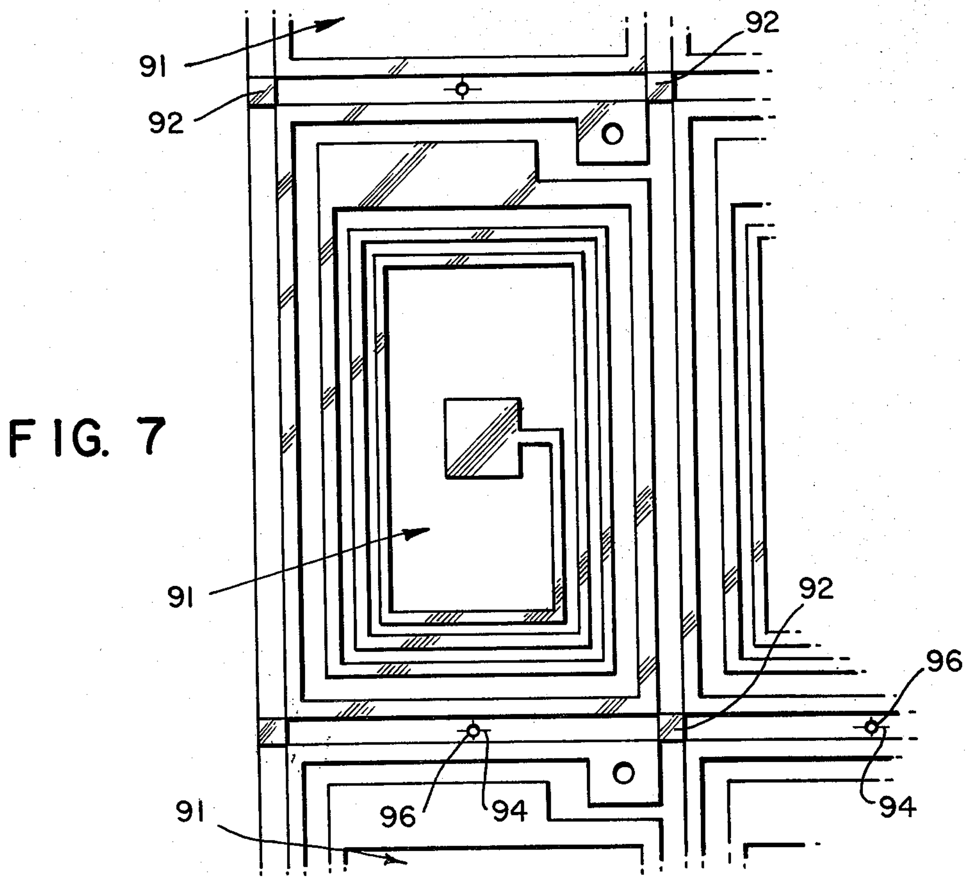
FIG. 7 is a pictorial representation of a plurality of planar circuits formed on a surface of the substrate web.

The respective circuit patterns are formed on the opposite surfaces of the laminated web in a repetitive manner, such as shown in FIG. 7, which depicts a plurality of circuit patterns 91 repetitively printed on the aluminum surface of the web. The corresponding circuit pattern on the opposite aluminum surface of the web is similarly printed in registered positions with the illustrated patterns to form a repetitive array of planar circuits which can subsequently be separated for individual use. Also printed with the circuit patterns 91 can be registration marks 92, the edges of which can be photoelectrically or otherwise sensed in known manner to maintain registration of the tag circuits with the processing apparatus. Similar registration marks are provided in alignment with marks 92 on the opposite web surface. For mechanical registration, holes 96 can be punched or otherwise formed at predetermined positions through the web with respect to the tag circuits printed thereon, such mechanical registration being generally less expensive than photoelectric registration systems. The position at which the registration holes are punched can be determined by photoelectric or other suitable means for sensing the position at which a hole is to be punched, or a position from which the hole location can be determined. For example, the holes can be punched at positions determined by target marks 94 printed at the desired locations along with printing of the circuit pattern.

Figure 8:
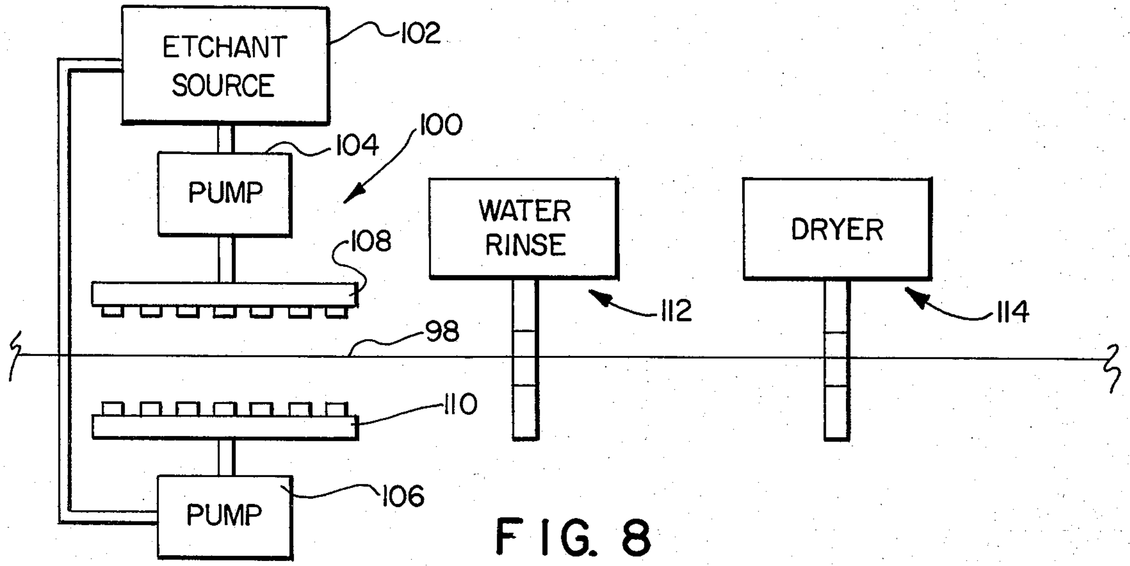
FIG. 8 is a diagrammatic representation of an etching station at which the circuit patterns are etched on the conductive surfaces.

Depending upon the layout of a particular processing facility, the web can next be directed to an etching station, or if the etching facility is located at a different site the web is rewound and conveyed to the etching facility. At an etching station, shown in FIG. 8, the printed web 98 is passed through continuous spray etching apparatus 100 having an etchant source 102, pumps 104 and 106, and nozzles 108 and 110 adjacent respective opposite surfaces of web 98, to chemically remove all unprinted aluminum foil on both sides of the web. The web is then passed through water rinse apparatus 112 which washes off remaining chemicals, after which the web is conveyed through an air dryer 114 to dry the thus processed web. The web can then be rewound onto a reel for conveyance to the next processing facility or if a continuous facility is employed the web is directly transported to the next processing station. The registration marks 92 remain after etching and the underlying foil areas interconnect the adjacent circuit patterns and serve to enhance the structural strength thereof during further processing.

During the etching process, the printing ink is not removed, thereby providing considerable saving of processing time and cost. The etchant typically is a dilute ferric chloride solution applied in a spray with accurate control of temperature, concentration and pump pressure in conjunction with the web speed employed in a particular process. Since the two sides of aluminum are of different thicknesses, it is usually desired to employ different pump pressures for the etchant applied to respective surfaces of the web or to provide increased line widths on the thinner aluminum surface to compensate for the different etching speeds.

The roll of etched tags is usually next slit into narrower rolls, say two tags wide, to permit processing in an economical manner on commercially standard label processing equipment. It will be appreciated that such slitting of the web is not a necessity but is convenient to allow employment of available processing apparatus.

Figure 9:
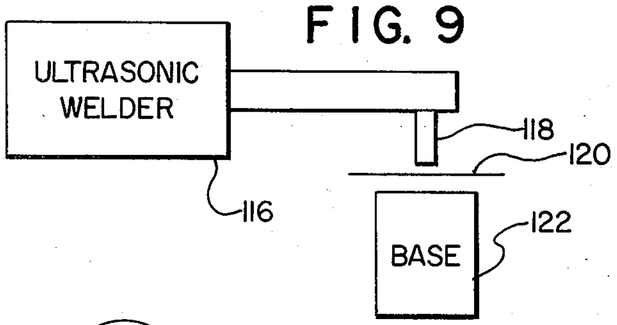
FIG. 9 is a diagrammatic representation of ultrasonic welding apparatus useful in the invention.
Figure 10:
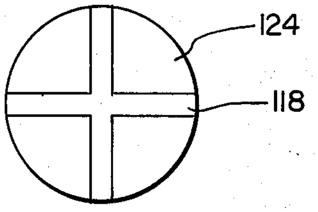
FIG. 10 is a pictorial representation of a preferred welding tip configuration useful in the invention.

In order to provide an electrical connection between the two conductive patterns of the planar resonant circuit, the conductive patterns on respective web surfaces are interconnected through the ink pattern and the substrate typically by welding of the confronting conductive surfaces. Such weld can be made by conveying each tag circuit to an ultrasonic welder 116, as shown in FIG. 9, which includes a welding tip 118 which presses the circuit 120 at an intended position between the tip and a heated base 122 for a predetermined dwell time. The heated base is useful to soften the substrate film of circuit 120 to permit the use of substantially lower ultransonic welding power and lower clamping force than if the web were unheated during the welding operation. The ultrasonic welder operates typically at a frequency of 40 KHz with an input power of 40 watts. The dwell time, welding time, temperature and clamping force are each variable to accommodate the particular materials being employed in the tag circuits being fabricated. Preferably, welding tip 118 has a flat end surface divided into four sectors 124 as shown in FIG. 10. By use of this sector tip configuration, the tip pressure is increased and four spot welds are provided for each application of the welding tip to the tag circuit. Individual tag circuits can be welded singly or two or more circuits can be simultaneously welded, as determined by the particular welding machinery employed in a particular process.

Welding techniques other than ultrasonic welding can also be employed to electrically interconnect the opposite conductive surfaces of the tag circuit. Cold welding techniques are also useful in performing this step of the novel process. Such cold welding can be acomplished by positioning a cold welding tool usually having a chisel-like tip configuration at the desired position with respect to a tag circuit supported by a suitable base and applying sufficient force to the cold welding tool to drive the tool through the laminated structure and cold weld the confronting conductive surfaces. Cold welding is the preferred technique in many instances as it is usually faster than ultrasonic welding and requires relatively less expensive and complex welding apparatus to provide a reliable and repeatable weld. Other interconnection techniques can also be employed to provide the conductive through connection. When the invention is employed for the fabrication of circuits not requiring a conductive connection between opposite conductive patterns, this interconnection step can accordingly be eliminated.

Figures 11, 12:
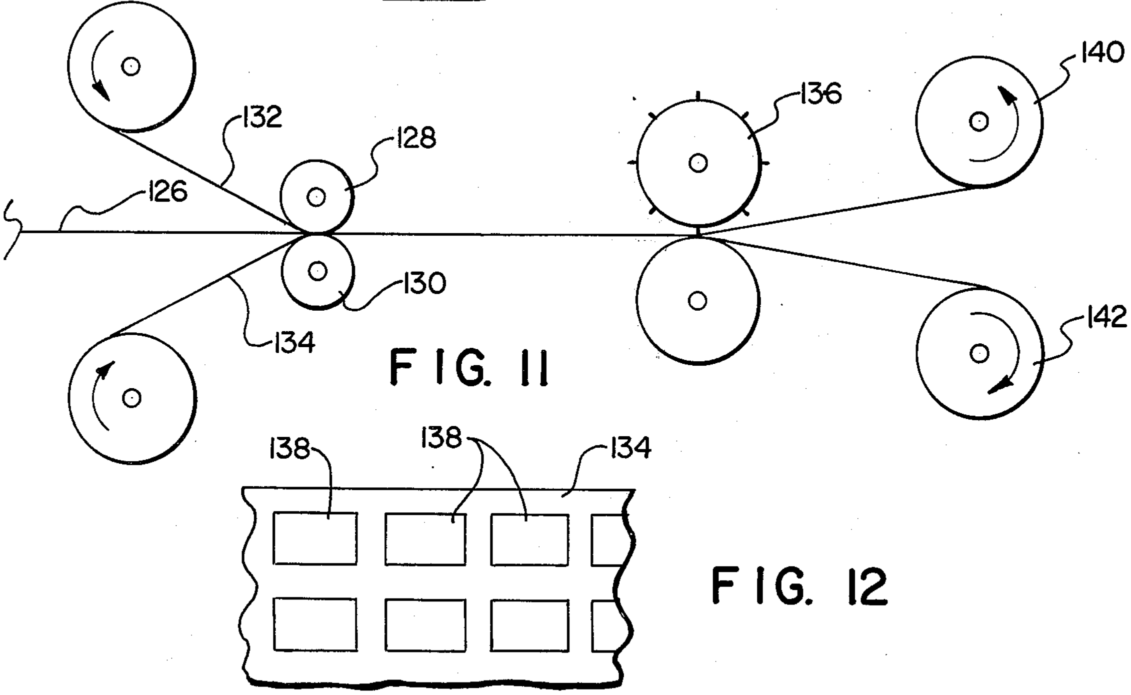
FIG. 11 is a diagrammatic representation showing the formation of individual tag circuits between paper layers.
FIG. 12 is a diagrammatic representation showing a plurality of planar circuits adhered to a release layer.

The tag circuits are now in condition to be processed into individual tags. Referring to FIG. 11, the web 126 having the circuit patterns of FIGS. 1 and 7 on the upper surface thereof and the circuit patterns of FIG. 2 on the lower surface, is adhesively laminated to paper or other suitable sheet material by passing the web through pressure rollers 128 and 130 together with a paper or other sheet 132 having a pressure sensitive adhesive on the surface confronting web 126, and together with a release sheet 134 also having pressure sensitive adhesive on the surface confronting web 126. The laminated web is then fed to a rotary die cutter 136 which cuts out the waste material which is not part of the tag circuits; namely, the registration marks 92 which interconnect adjacent circuit patterns, as shown in FIG. 7. The die cutter is operative to cut through several layers of the web but not through the release sheet 134. The waste material adhered to sheet 132 is stripped away on sheet 132 and wound on a takeup reel 140, or otherwise disposed of. The separated tags 138 adhered to the release sheet 134 in the manner depicted in FIG. 12 are wound onto storage reel 142. The reel of tags can, if desired, be slit lengthwise to provide respective rolls of single tags.

For affixing to items being protected, individual tags are usually laminated between appropriate outer layers of paper, plastic or other material. Such outer surfaces can be provided by laminating the roll of tags and then cutting the individual tags from the laminated roll.

It will be appreciated that the novel process can be employed for the fabrication of printed circuits other than resonant tag circuits such as described above. The particular substrate and conductive foil employed of course depend upon the requirements of the particular circuit, which govern the choice of materials having the requisite mechanical and electrical properties for the particular purpose. In the resonant tag fabrication described above, the aluminum foil is laminated to the substrate without the use of adhesives in order to maintain precise thickness tolerance and requisite dielectric properties of the substrate between the spaced conductive surfaces. For circuits that do not require a low dissipation factor or as precise a thickness tolerance, adhesives can be employed in affixing the conductive foil to the substrate. In addition, where thickness tolerance is not critical, the initial laminate can be made by extruding a layer of liquid plastic material between two spaced webs of aluminum or other conductive foil and then passing the extruded laminate through chilled rollers. While the rotogravure technique is preferred for printing the circuit patterns on the conductive foils, other printing techniques such as dry and wet offset techniques can also be employed.

It will also be appreciated that the novel process can be varied in particular aspects and can be practiced with different specific apparatus to accommodate the requirements of a particular operational process for the provision of different types of resonant or other planar circuits. It is not intended therefore to limit the invention by what has been shown and described except as indicated in the appended claims.

What is claimed is:

1. A method for fabricating a plurality of individual planar resonant tags each having at least one self-contained operative tuned circuit with integrally formed circuit elements including at least one inductor and at least one capacitor, said method comprising the steps of:

providing an insulative substrate web of material of predetermined thickness and dielectric characteristics and with a conductive surface on each opposite side thereof;

printing with an etchant-resistive material a first repetitive circuit pattern including the formation of at least one inductor and a conductive area serving as a portion of said at least one capacitor on one conductive surface of said substrate web;

printing with an etchant-resistive material a second repetitive circuit pattern on the other conductive surface of said substrate web in predetermined relation to said first repetitive circuit pattern and including the formation of a conductive area in alignment with the conductive area on said one conductive surface and serving as a portion of said at least one capacitor;

said first and second printed circuit patterns providing said planar tags with said conductive areas and the interposed dielectric material provided by said substrate web defining said at least one capacitor;

etching said first and second circuit patterns to remove unprinted portions of said conductive surfaces on both sides of said substrate web thereby to provide repetitive first and second cooperative conductive circuit patterns conforming to said printed circuit patterns; and separating cooperative circuit patterns to provide individual planar resonant tags.

2. The method according to claim 1 wherein said conductive surface providing step includes the steps of:

providing an electrically insulative web of material of predetermined thickness and having a low dissipation factor at a frequency of interest and a stable dielectric constant;

treating the opposite surfaces of said web by corona discharge to enhance the bonding characteristics of said surfaces; and laminating first and second conductive foils respectively to said treated surfaces.

3. The method according to claim 1 wherein said separating step includes:

laminating said web containing said cooperative circuit patterns to at least a first sheet;

die cutting each of said cooperative circuit patterns representing an individual planar resonant tag from waste material; and separating said waste material from said first sheet containing individual planar resonant tags.

4. The method according to claim 1 wherein said separating step includes:

laminating said web containing said cooperative circuit patterns to at least a first sheet;

die cutting each of said cooperative circuit patterns representing an individual planar resonant tag; and removing from said first sheet said individual planar resonant tags.

5. The method according to claim 1 wherein said conductive surface providing step includes the steps of:

providing an electrical insulative web of material of predetermined thickness and having a low dissipation factor at a frequency of interest and a stable dielectric constant;

treating the opposite surfaces of said web to enhance the bonding characteristic of said surfaces; and laminating first and second conductive foils respectively to said treated surfaces.

6. The method according to claim 1 wherein said printing steps include the printing of registration marks together with said circuit patterns on the respective conductive surfaces of said substrate web, said registration marks being in physical interconnection between adjacent ones of at least one of said repetitive circuit patterns.

7. The method according to claim 1 wherein said printing steps are accomplished before provision of said conductive surfaces on said substrate web.

8. The method according to claim 1 wherein said printing steps are accomplished after provision of said conductive surfaces of said substrate web.

9. The method according to claim 1 wherein said etching step is accomplished without removal of said etchant-resistive material defining said circuit patterns.

10. The method according to claim 1 wherein said printing steps include printing with an etchant-resistive material said repetitive circuit patterns on said conductive surfaces without prior cleaning of said conductive surfaces.

11. The method according to claim 1 wherein said printing steps include printing with a non-photoresponsive etchant-resistive material.

12. The method according to claim 1 wherein at least one of said printing steps includes printing with said etchant-resistive material a plurality of fusible links each in circuit with an associated one of said repetitive circuit patterns.

13. The method according to claim 1 wherein said printing steps include high speed web fed press printing.

14. The method according to claim 1 further including the step of electrically connecting said first and second cooperative conductive circuit patterns of each of said planar circuits through said substrate at at least one selected position thereof.

15. The method according to claim 2 wherein said electrical connection is formed by welding said first and second cooperative conductive circuit patterns through said substrate at said at least one selected position thereof.

16. The method according to claim 15 wherein said welding step includes:

disposing each of said circuit patterns at a heated base to soften said substrate; and applying an ultrasonic welding tip to said circuit pattern at said selected position to form said electrical connection.

17. The method according to claim 15 wherein said welding step includes the provision of a cold weld between said first and second conductive circuit patterns at said at least one selected position to form said electrical connection.

18. The method according to claim 15 wherein said welding step includes the provision of an ultrasonic weld between said first and second conductive circuit patterns at said at least one selected position to form said electrical connection.

19. The method according to claim 18 wherein said ultrasonic weld is provided by a multiple sector welding tip operative to provide multiple spot welds between said first and second conductive circuit patterns.

20. The method according to claim 1 wherein said printing steps include the printing of registration marks together with said circuit pattens on the conductive surfaces of said substrate web.

21. The method according to claim 20 including the further step of punching one or more holes through said substrate web at selected positions with respect to said first and second circuit patterns to serve as registration elements.

22. The method according to claim 1 wherein said printing steps include the rotogravure printing of said circuit patterns.

23. The method according to claim 11 wherein said printing steps further include printing with a black nitrocellulose ink to form said circuit patterns.

24. The method according to claim 1 wherein said separating step includes:

laminating said web containing said cooperative pairs of circuit pattern between first and second sheets;

die cutting each circuit pattern pair; and separating said second sheet containing individual die cut planar circuits from said first sheet to provide individual planar resonant tags.

25. The method according to claim 24 further including the step of slitting said second sheet along the length thereof to provide respective rolls of single planar circuits.

26. The method according to claim 1 wherein said substrate web is polyethylene and wherein said conductive surfaces are aluminum foil.

27. The method according to claim 26 wherein said aluminum foil is bonded to said polyethylene web with the dull side of said aluminum foil in contact with said web.

28. The method according to claim 27 wherein one of said aluminum foils is of a thickness greater than the other to provide predetermined lower electrical resistance for planar inductors formed thereof as part of said planar circuit.

29. The method according to claim 28 wherein said etching step includes etching the ones of said circuit patterns having aluminum foil of greater thickness at a higher rate than said other circuit pattern to provide the same etching time for said foils of different thicknesses.

30. The method according to claim 27 wherein said printing steps include printing with an etchant-resistive material said repetitive circuit patterns on the shiny surfaces of said aluminum foil without prior cleaning of said shiny surfaces.

* * * * *